(12) United States Patent
Ishikawa

(10) Patent No.: US 7,818,147 B2
(45) Date of Patent: Oct. 19, 2010

(54) ANALYSIS DATA JUDGING APPARATUS, SIMULATION SYSTEM AND SIMULATION PROGRAM

(75) Inventor: Shigeo Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1081 days.

(21) Appl. No.: 11/341,594

(22) Filed: Jan. 30, 2006

(65) Prior Publication Data

US 2007/0088536 A1    Apr. 19, 2007

(30) Foreign Application Priority Data

Oct. 14, 2005    (JP)    ............................ 2005-300247

(51) Int. Cl.
*G06F 17/50* (2006.01)

(52) U.S. Cl. .................................... 703/1; 703/2; 703/6

(58) Field of Classification Search ...................... 703/1, 703/6, 7, 21, 2
See application file for complete search history.

(56) References Cited

FOREIGN PATENT DOCUMENTS

| JP | 11-102382 | 4/1999 |
|---|---|---|
| JP | 2004-347571 | 12/2004 |

*Primary Examiner*—Russell Frejd
(74) *Attorney, Agent, or Firm*—Fujitsu Patent Center

(57) ABSTRACT

A technique that can obtain right results of a simulation if the user does not have sophisticated knowledge about strength analysis simulations is provided. An analysis data judging apparatus comprises an analysis results acquiring section that acquires analysis data relating to the results of analysis of a strength analysis simulation executed for an object of analysis model and a judging section that determines whether the analysis data acquired by the analysis results acquiring section shows a predetermined deformed state of a predetermined part according to the threshold value set for the predetermined part of the object of analysis model or not.

12 Claims, 11 Drawing Sheets

ANALYSIS DATA JUDGING APPARATUS, SIMULATION SYSTEM AND SIMULATION PROGRAM

BACKGROUND OF THE INVENTION

1. Field of the Invention

This invention relates to an analysis data judging apparatus, a simulation system and a simulation program that can provide right results of a simulation if the user does not have any sophisticated knowledge about strength analysis simulations.

2. Description of the Related Art

Various techniques for strength analysis simulations on structure models to be analyzed are known (see, inter alia, Patent Document 1: Jpn. Pat. Appln. Laid-Open Publication No. Hei 11-1023382 and Patent Document 2: Jpn. Pat. Appln. Laid-Open Publication No. 2004-347571).

When conducting a non-linear structure simulation such as press simulation on a structure formed by assembling a plurality of parts, the designer of the structure normally asks a simulation analysis specialist to analyze the structure, showing the structural requirements and the items of the evaluation test to be conducted to the specialist. The analysis specialist who is asked to analyze the structure prepares a numerical model according to the instructions given to him or her, executes a simulation and reports the results (of the evaluation test) of the simulation to the designer. If the results of the simulation do not meet the requirements of the design specifications, the designer modifies the design and asks the analysis specialist for a simulation analysis once again. The design becomes perfect as the process of asking a simulation and reporting the results is repeated by the designer and the analysis specialist.

With the prior art, if the designer and the analysis specialist show discrepancies, if slightly and unconsciously, in terms of recognition of the design purposes and the evaluation items, the simulation executed and the report submitted by the analysis specialist can give rise to alterations and modifications to the design that may entail unnecessary recalculations and waste of time.

If the designer can execute the simulation by him- or herself, the above-described problem of waste of time can be eliminated. However, sophisticated strength analysis simulations such as non-linear structure analysis simulations require sophisticated special knowledge and skills and it is difficult for ordinary designers to do such simulations.

SUMMARY OF THE INVENTION

In view of the above-identified circumstances, it is therefore the object of the present invention to provide a technique for obtaining right results of a simulation if the user does not have sophisticated knowledge about strength analysis simulations.

In an aspect of the present invention, the above object is achieved by providing an analysis data judging apparatus comprising: an analysis results acquiring section that acquires analysis data relating to the results of analysis of a strength analysis simulation executed for an object of analysis model and a judging section that determines whether the analysis data acquired by the analysis results acquiring section shows a predetermined deformed state of a predetermined part according to the threshold value set for the predetermined part of the object of analysis model or not.

In an analysis data judging apparatus according to the present invention, preferably the threshold value is a stress value or a strain value determined on the basis of the rupture value required for the predetermined part and the judging section determines whether the analysis data acquired by the analysis results acquiring section for the predetermined part means fracture of the predetermined part or not according to the threshold value set for the predetermined part of the object of analysis model.

In an analysis data judging apparatus according to the present invention, if the object of analysis model is constituted by a plurality of components, preferably a threshold value is set for each of the plurality of components.

In another aspect of the present invention, there is provided a simulation system comprising: a first set information acquiring section that acquires first set information set as information defining the simulation environment at the time of executing a strength analysis simulation for an object of analysis model; a second set information acquiring section that acquires predetermined related information relating to the first set information or a predetermined parameter value for identifying the contents of the first set information as second set information preset according to the first set information acquired by the first set information acquiring section so as to correspond to the first set information on the object of analysis model; and a simulation executing section that causes a computer to execute the strength analysis simulation in the simulation environment defined by the first set information acquired by the first set information acquiring section and the second set information acquired by the second set information acquiring section.

In a simulation system according to the present invention, preferably the first set information acquiring section acquires information on the method of supplying a load to the object of analysis model as the first set information and the second set information acquiring section acquires information on the jig supporting the object of analysis model according to the information on the method of supplying a load as acquired by the first set information acquiring section.

In a simulation system according to the present invention, preferably the first set information acquiring section acquires information on the mesh size at the time of dividing the object of analysis model by a mesh as the first set information and the second set information acquiring section acquires information on the mesh size at the time of dividing the jig supporting the object of analysis model by a mesh according to the information on the mesh size acquired by the first set information acquiring section.

In a simulation system according to the present invention, preferably the first set information acquiring section acquires information on the size of the object of analysis model as the first set information and the second set information acquiring section acquires information on the size of the jig supporting the object of analysis model according to the information on the size of the object of analysis model as acquired by the first set information acquiring section.

In still another aspect of the present invention, there is provided a simulation program for causing a computer to execute: an analysis results acquiring step that acquires analysis data relating to the result of analysis of a strength analysis simulation executed for an object of analysis model, and a judging step that determines whether the analysis data acquired in the analysis results acquiring step shows a predetermined deformed state of a predetermined part according to the threshold value set for the predetermined part of the object of analysis model or not.

In a simulation program according to the present invention, preferably the threshold value is a stress value or a strain value determined on the basis of the rupture value required for the predetermined part and the judging step is adapted to determine whether the analysis data acquired in the analysis results acquiring step for the predetermined part means fracture of the predetermined part or riot according to the threshold value set for the predetermined part of the object of analysis model.

In a simulation program according to the present invention, if the object of analysis model is constituted by a plurality of components, preferably a threshold value is set for each of the plurality of components.

Preferably, a simulation program according to the invention further comprises: a first set information acquiring step that acquires first set information set as information defining the simulation environment at the time of executing a strength analysis simulation for an object of analysis model; a second set information acquiring step that acquires predetermined related information relating to the first set information or a predetermined parameter value for identifying the contents of the first set information as second set information preset according to the first set information acquired in the first set information acquiring step so as to correspond to the first set information on the object of analysis model; and a simulation executing step that causes a computer to execute the strength analysis simulation in the simulation environment defined by the first set information acquired in the first set information acquiring step and the second set information acquired in the second set information acquiring step.

In a simulation program according to the present invention, preferably the first set information acquiring step is adapted to acquire information on the method of supplying a load to the object of analysis model as the first set information and the second set information acquiring step is adapted to acquire information on the jig supporting the object of analysis model according to the information on the method of supplying a load as acquired in the first set information acquiring step.

In a simulation program according to the present invention, preferably the first set information acquiring step is adapted to acquire information on the mesh size at the time of dividing the object of analysis model by a mesh as the first set information and the second set information acquiring step is adapted to acquire information on the mesh size at the time of dividing the jig supporting the object of analysis model by a mesh according to the information on the mesh size acquired in the first set information acquiring step.

In a simulation program according to the present invention, preferably the first set information acquiring step is adapted to acquire information on the size of the object of analysis model as the first set information and the second set information acquiring step is adapted to acquire information on the size of the jig supporting the object of analysis model according to the information on the size of the object of analysis model as acquired in the first set information acquiring step.

Thus, according to the present invention as defined above in detail, it is possible to provide a technique for obtaining right results of a simulation if the user does not have sophisticated knowledge about strength analysis simulations.

DETAILED DESCRIPTION OF THE PREFERRED EMBODIMENTS

Now, the present invention will be described in greater detail by referring to the accompanying drawings that illustrate preferred embodiments of the invention.

An embodiment of simulation system according to the present invention is communicably connected to a simulation apparatus 2 (typically comprising a PC and a work station) that is adapted to execute a strength analysis simulation on a given object of analysis model and a database 3 for storing various data by way of a telecommunication line. Furthermore, this embodiment of simulation system according to the invention can set a simulation environment for executing a strength analysis simulation by means of the simulation apparatus and acquire various data including analysis data obtained as a result of strength analysis simulation executed by the simulation apparatus.

Figure 1:
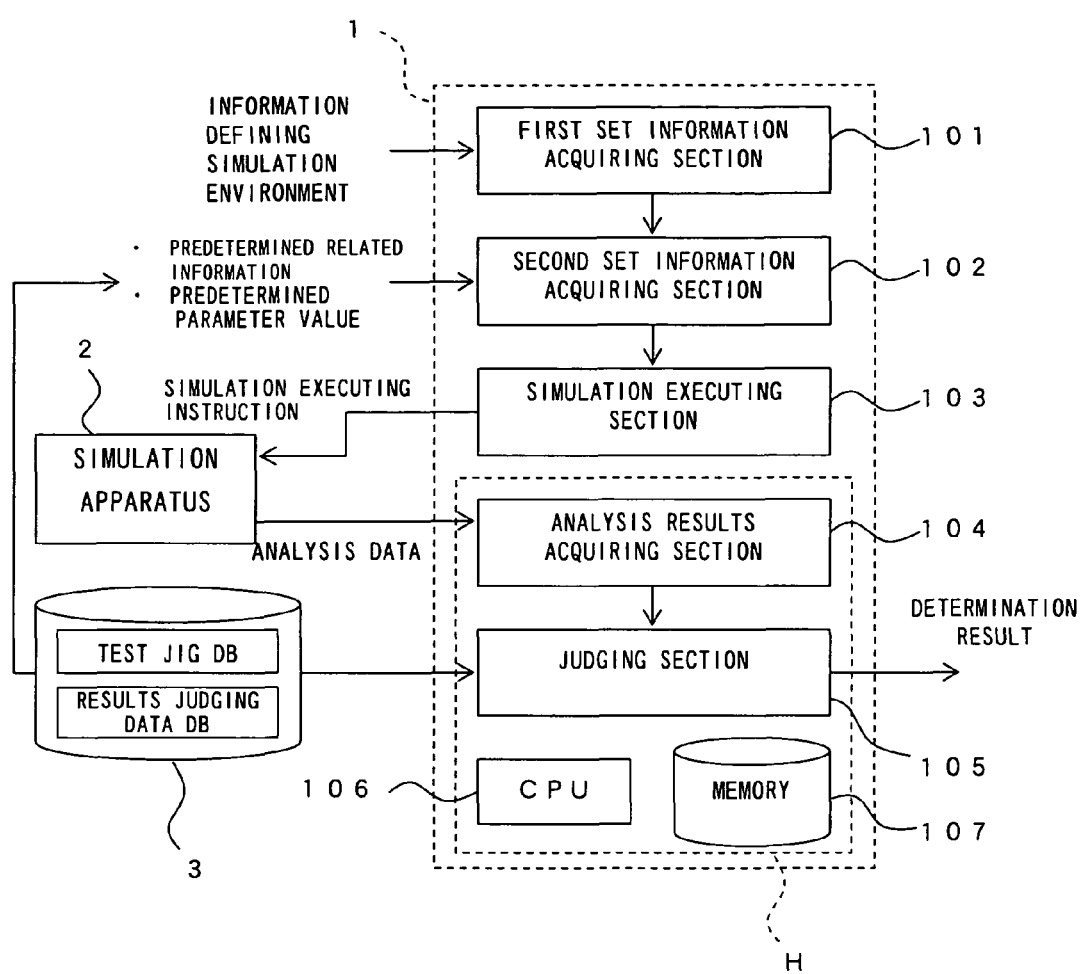
FIG. 1 is a schematic functional block diagram of an embodiment of simulation system according to the invention.

FIG. 1 is a schematic functional block diagram of the embodiment of simulation system according to the invention, illustrating the system. The simulation system 1 of this embodiment comprises a first set information acquiring section 101, a second set information acquiring section 102, a simulation executing section 103, an analysis results acquiring section 104, a judging section 105, a CPU 106 and a memory 107. In this embodiment, the analysis results acquiring section 104, the judging section 105, the CPU 106, the memory 107, an operation input section (not shown) and a display section (not shown) constitute an analysis data judging apparatus H.

The first set information acquiring section 101 takes a role of acquiring first set information that is set as information defining the simulation environment where a strength analysis simulation is to be executed for an object of analysis model. The acquired first set information is stored in a memory region of the simulation apparatus or of an external apparatus communicably connected to the simulation apparatus so as to be set for the simulation apparatus 2. Thus, the first set information acquiring section 101 acquires the first set information stored in the memory region. However, the information defining the simulation environment where a strength analysis simulation is to be executed by the simulation apparatus 2 may be stored in any other place so long as the first set information acquiring section can acquire the information.

The second set information acquiring section 102 takes a role of acquiring second set information that is preset according to the first set information acquired by the first set information acquiring section 101 so as to correspond to the first set information on the object of analysis model. The second set information is predetermined related information relating to the first set information or a predetermined parameter value for identifying the contents of the first set information. The second set information is typically stored in the database 3.

The simulation executing section 103 takes a role of causing the simulation apparatus 2 to execute a strength analysis simulation in the simulation environment defined by the first set information acquired by the first set information acquiring section 101 and the second set information acquired by the second set information acquiring section 102.

The analysis results acquiring section 104 takes a role of acquiring analysis data relating to the analysis results of the strength analysis simulation executed for the object of analysis model from the simulation apparatus 2.

The judging section 105 takes a role of determining whether the analysis data acquired by the analysis results acquiring section 104 shows a predetermined deformed state of a predetermined part according to the threshold value set for the predetermined part of the object of analysis model or not. More specifically, the threshold value is a stress value or a strain value computationally determined on the basis of the rupture value required for the predetermined part and is stored in "results judging data DB" in the database 3. The judging section 105 acquires the threshold value set for the predetermined part of the object of analysis model from the "results judging data DB" and determines whether the analysis data acquired by the analysis results acquiring section 104 on the predetermined part means fracture of the predetermined part or not according to the threshold value. It may be needless to say that it is not necessary to store the threshold value to the outside of the judging section 105 but may alternatively have the judging section 105 store it in advance.

The CPU 106 takes a role of executing various processes in the simulation system and also a role of realizing various functional features by executing any of the programs stored in the memory 107. The memory 107 typically comprises a ROM and a RAM so as to take a role of storing various pieces of information and programs to be utilized in the simulation system. The operation input section (not shown) typically comprises a keyboard and a mouse to receive operation inputs from the user. The display section (not shown) typically comprises a CRT display or a liquid crystal display and is adapted to display various pieces of information on the display screen thereof.

Figure 2:
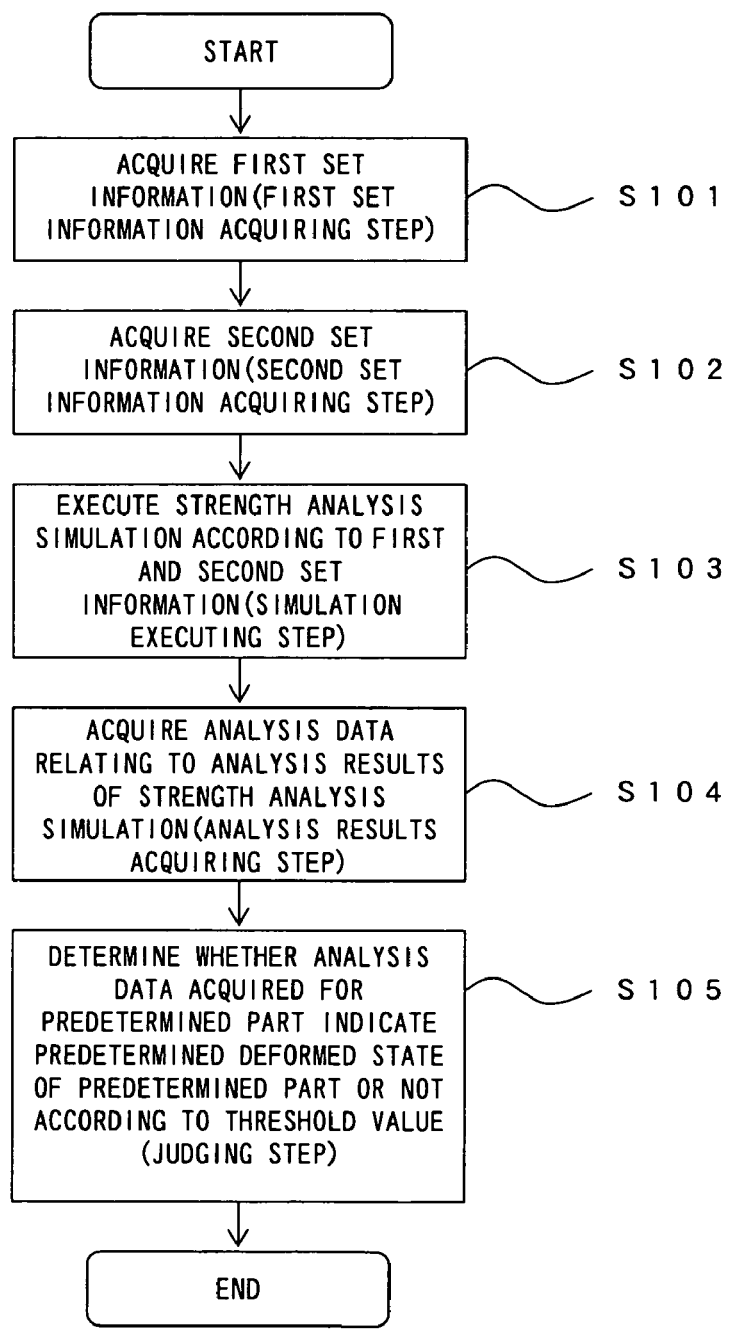
FIG. 2 is a flowchart of the process to be executed by the embodiment of simulation system of FIG. 1, illustrating the flow of the process.

FIG. 2 is a flowchart of the process to be executed by the embodiment of simulation system of FIG. 1, roughly illustrating the flow of the process.

The first set information acquiring section 101 acquires first set information for defining the simulation environment of executing a strength analysis simulation for the object of analysis model (first set information acquiring step) (S101).

More specifically, the first set information acquiring section 101 acquires information on the method of supplying a load to the object of analysis model, information on the mesh size to be used for dividing the object of analysis model by a mesh, information on the size of the object of analysis model and so on (first set information acquiring step).

The second set information acquiring section 102 acquires second set information on the object of analysis model that is preset so as to correspond to the first set information according to the first set information acquired in the first set information acquiring step (predetermined related information relating to the first set information or a predetermined parameter value for identifying the contents of the first set information) (second set information acquiring step) (S102).

More specifically, the second set information acquiring section 102 can acquire information on the jig supporting the object of analysis model (e.g., information for selecting a jig of an optimal type for the test to be conducted) according to the information on the method of supplying a load (first set information), information on the mesh size to be used when dividing the jig supporting the object of analysis model by a mesh (e.g., information for always making the mesh size of the jig smaller than the mesh size of the object of analysis model) according to the information on the mesh size (first set information), information on the size of the jig supporting the object of analysis model (e.g., a rule of always making the size of the jig larger than the size of the object of analysis model, specific dimensions of the jig suitable for the object of analysis model, etc.) according to the size of the object of analysis model (first set information). While the second set information is stored in the database 3 in a state where it is associated with the first set information (in a state where the second set information can be retrieved according to the first set information) in this embodiment, the present invention is by no means limited thereto. It may alternatively be stored in a memory region of the simulation system 1 (e.g., the memory 107) or in a memory region of an external apparatus such as the simulation apparatus 2.

The simulation executing section 103 issues an instruction to the simulation apparatus 2 to execute a strength analysis simulation in the simulation environment defined by the first set information acquired in the first set information acquiring step and the second set information acquired in the second set information acquiring step (simulation executing step) (S103).

The analysis results acquiring section 104 acquires the analysis data relating to the results of the analysis of the strength analysis simulation executed by the simulation apparatus 2 for the object of analysis model from the simulation apparatus 2 (analysis results acquiring step) (S104).

The judging section 105 determines whether the analysis data acquired in the analysis results acquiring step shows a predetermined deformed state of the predetermined part according to the threshold value set for the predetermined part of the object of analysis model or not (judging step) (S105).

The threshold value is a stress value or a strain value determined on the basis of the rupture value required for the predetermined part (e.g., a component of the object of analysis model) that is predetermined in an experiment. If the object of analysis model is constituted by a plurality of components, a threshold value is set for each of the plurality of components. Thus, the judging section 105 determines whether the analysis data acquired for the predetermined part by the analysis results acquiring section 104 means fracture of the predetermined part or not according to the threshold value.

Figure 3:
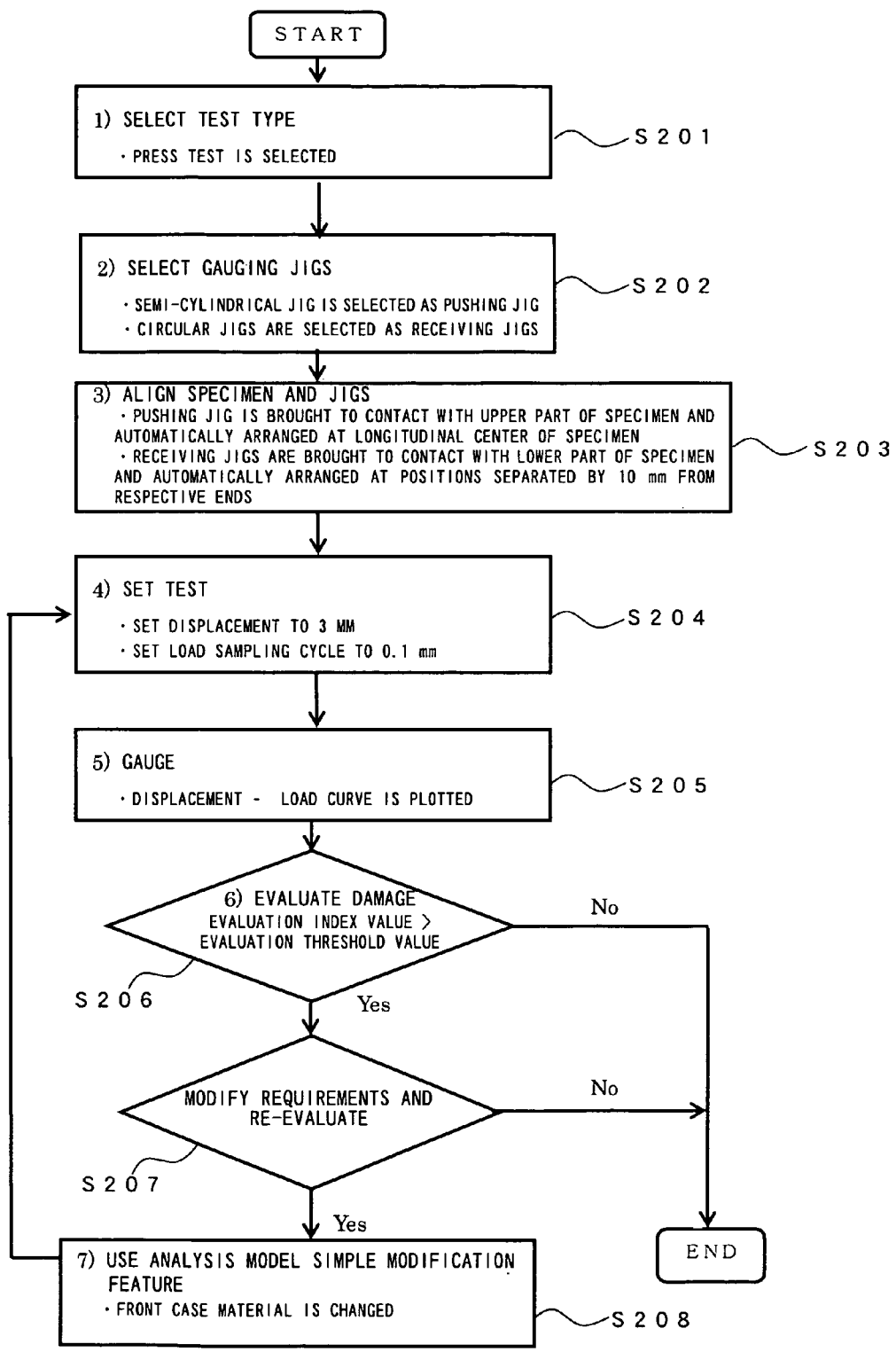
FIG. 3 is a flowchart of the process to be executed by the embodiment of simulation system of FIG. 1, illustrating the process in greater detail.

FIG. 3 is a flowchart of the process to be executed by the embodiment of simulation system of FIG. 1, illustrating the overall process.

Firstly, as the method of supplying a load to the object of analysis model (the type of test) is selected by the user at the simulation apparatus 2, the first set information acquiring section 101 acquires information on the selected method of supplying a load as first set information (S201). While a "press test" is selected here as the type of test, it is possible to select a "torsion test", a "tensile test" or a test of some other type.

Subsequently, the second set information acquiring section acquires information on the gauging jigs suitable for executing the test as second set information. Here, a semi-cylindrical jig and circular jigs are selected as pushing jig and receiving jigs respectively (S202).

Figure 4:
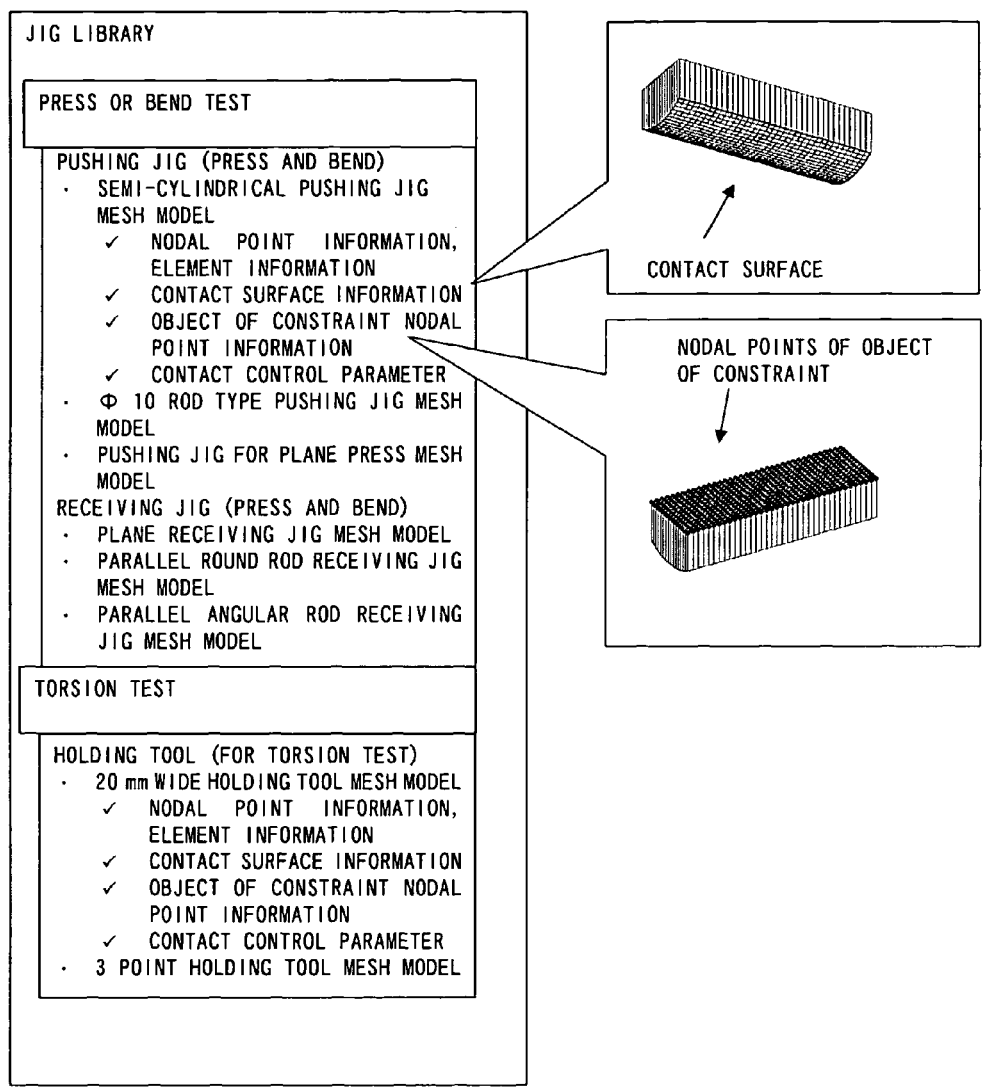
FIG. 4 is a schematic illustration of library information of a jig.

In this embodiment, library information on jigs (test jig data) as shown in FIG. 4 is stored in the database 3. The library information includes information on the know-how of the analysis specialist for executing sophisticated strength analysis simulations. More specifically, the library information includes information on the types of jigs most suitable for each method of supplying a load to an object of analysis model that can be selected, the most suitable positional relationship of each of the jigs relative to the object of analysis model (specimen), the most suitable size of each of the jigs relative to the size of the object of analysis model, the most suitable mesh size to be used at the time of dividing each of the jigs corresponding to the mesh size to be used at the time of dividing the object of analysis model by means of a mesh and so on.

For example, if rod-shaped receiving jigs and a semi-cylindrical press jig are selected, it is possible to execute a three-point bending test. If, on the other hand, a plane receiving jig and a plane pushing jig are selected, it is possible to execute a plane press test. The library for such jigs contains contact surface information defining the contact surface of each finite-element model that recalls the profile of a jig and the object of analysis model. The contact conditions of a selected jig and the object of analysis model are acquired automatically by the second set information acquiring section 102 from the library information stored in the database 3.

The second set information acquiring section 102 acquires information on the positional relationship between the object of analysis model and each of the jigs (such as coordinate values (corresponding to a predetermined parameter value)) from the library information stored in the database 3 as second set information according to the information on the jigs acquired in a manner as described above (S203) and aligns the specimen and the jig. In the illustrated instance, the pushing jig is brought into contact with an upper part of the specimen and automatically placed at the center in the longitudinal direction of the specimen, while the receiving jigs are brought into contact with a lower part of the specimen and automatically placed at respective positions separated from the corresponding ends by 10 mm.

Figure 5:
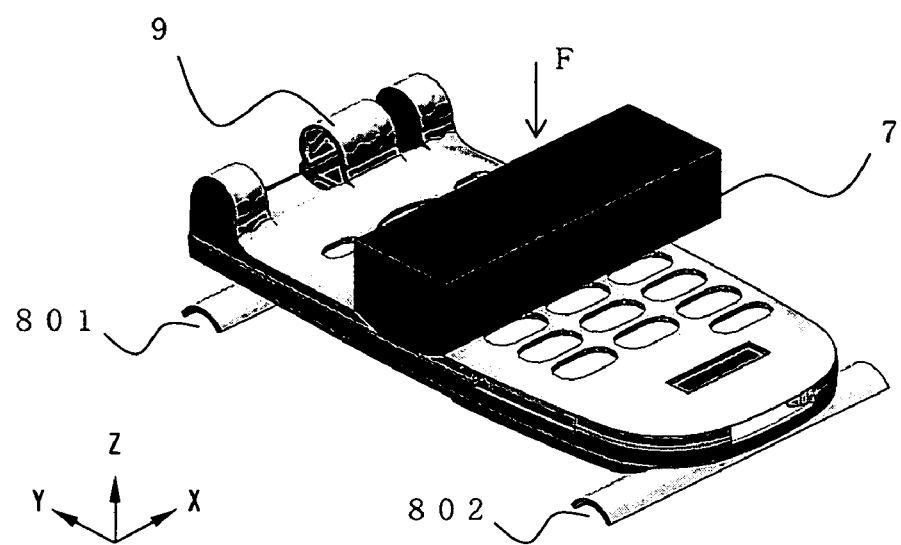
FIG. 5 is a schematic illustration of a strength analysis simulation being executed on an object of analysis model.

FIG. 5 is an artist image of a strength analysis simulation being executed on an object of analysis model. In FIG. 5, the object of analysis model 9 is subjected to a three-point bending test, where the object of analysis model 9 is supported at lower parts thereof respectively by receiving jigs 801 and 802 and pushed at an upper part thereof by a pushing jig 7 in the direction of F.

The second set information acquiring section 102 acquires details of the load to be applied to the object of analysis model (including the selected value of displacement and that of the load to be applied (which correspond to predetermined parameter values and predetermined related information)) from the library information stored in the database 3 as second set information according to the information on the method of supplying a load acquired in a manner as described above and defines the details of the load to be supplied in the test (S204). Thus, predetermined parameter values refers to numerical data and other data for identifying the information acquired as first set information in greater detail and may include the load applied by the pushing jig, the dimensions of the jigs, the distance and the time by which the pushing jig is pushed. Predetermined related information refers to information that is inevitably associated with the first set information (the mesh model of a jig of a type acquired as first set information, information defining the contact surface of the jig and the mesh model and so on). In the illustrated example, the displacement of the jig in the load supplying direction is defined to be 3 mm and the load sampling cycle is defined to be 0.1 mm.

Subsequently, the simulation apparatus 2 executes a strength analysis simulation according to the first set information and the second set information acquired in a manner as described above and the relationship between the displacement and the load is determined (S205).

If the object of analysis model comprises a plurality of components, the component to be evaluated is selected and if it is found as a result of the simulation that the stress or the strain produced in the component does not exceed the threshold value (evaluation threshold value) predefined for the component (S206, No), the process ends to conclude that there is no problem about the strength of the component.

If, on the other hand, it is found as a result of the simulation that the largest stress value or the largest strain value produced in the component exceeds the threshold value predefined for the component (S206, Yes), the judging section 105 decides that a certain deformed state such as fracture or deformation takes place in the component and, if the environment of simulation is (simulation requirements are) to be modified (S207, Yes), the simulation environment given to the simulation apparatus 2 by an instruction is at least partly modified (by changing the material of the component and/or adding a rib). Then, the simulation executing section 103 gives an order for executing the strength analysis simulation once again to the simulation apparatus 2. In the illustrated instance, the material of the specimen (front case) is changed.

As described above, with the simulation system of this embodiment, it is possible to set the environment for executing a strength analysis simulation by following operation procedures that resemble the procedures for the use of an actual press test apparatus.

Figure 6:
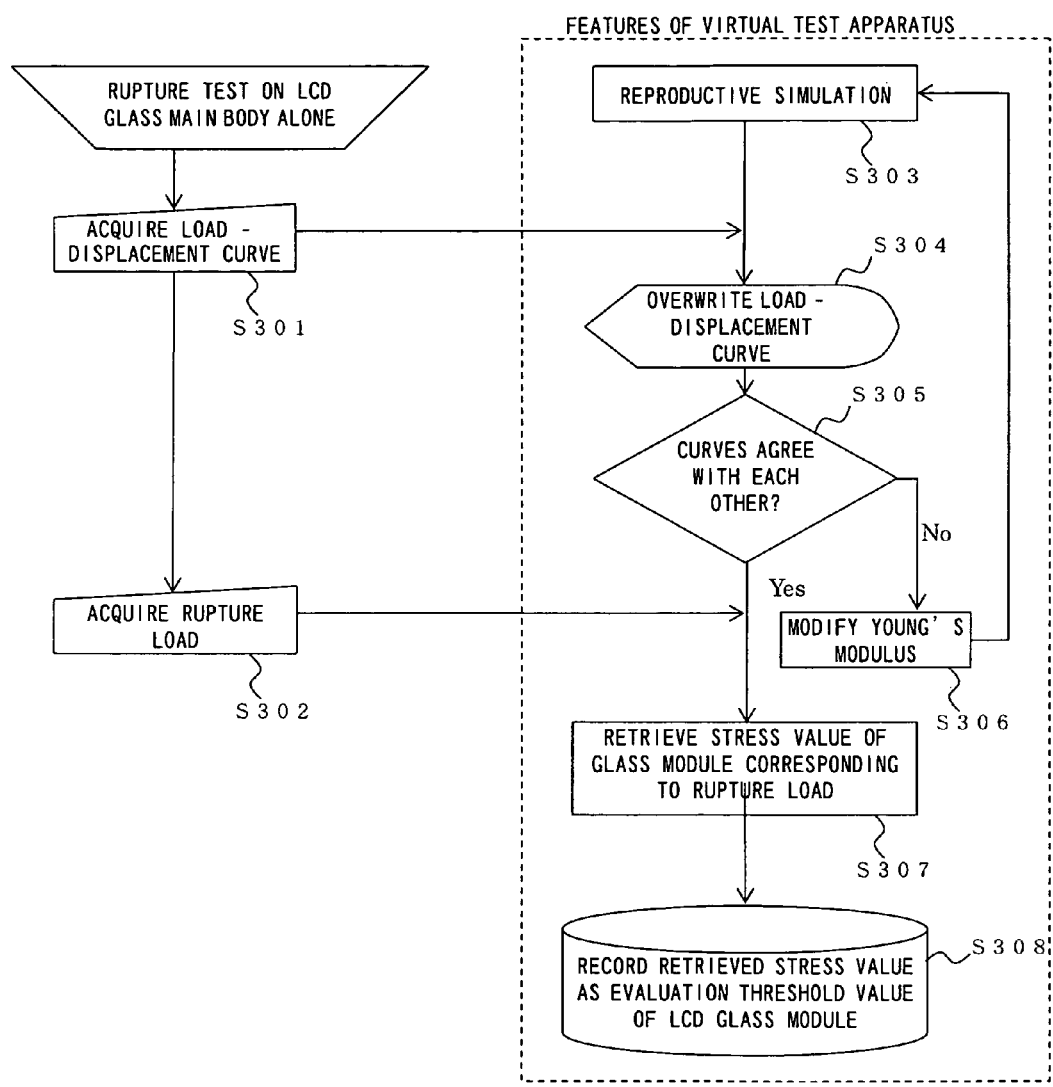
FIG. 6 is a flowchart of the process to be executed in order to determine the tolerable stress of a component of an object of analysis model.

Now, the method of determining a threshold value to be set for the object of analysis model will be described below. FIG. 6 is a flowchart of the process to be executed in order to determine the tolerable stress of a component of an object of analysis model. The method will be described here in terms of defining the threshold value of an LCD glass module for a mobile telephone set, which is the object of analysis model in this instance. Since an LCD glass module can easily break from a fine crack that can be produced in the course of processing glass, it is not feasible to simply select a material characteristic of glass as evaluation threshold value. In other words, in order to highly accurately evaluate the LCD glass module, it is necessary to actually carry out a rupture test and determine the rupture stress on the basis of the outcome of the test.

Firstly, a rupture test is conducted on the LCD glass module alone that is the object of analysis in order to acquire a load-displacement curve that illustrates the relationship between the load and the displacement (S301) and also acquire the rupturing load of the component (S302).

Then, a reproductive simulation of the above-described rupture test on the basis of the object of analysis model prepared corresponding to the LCD glass module is performed (S303) and the load-displacement curve obtained by the actual rupture test and the load-displacement curve obtained by the simulation are compared (S304).

If the load-displacement curve obtained by the reproductive simulation and the load-displacement curve obtained by the actual rupture test do not agree with each other (S305, No), the Young's modulus of the object of analysis model, which corresponds to the LCD glass module, that is defined as simulation environment for the reproductive simulation is modified (S306) and a reproductive simulation is executed once again, using the modified Young's modulus (S303).

If, on the other hand, the load-displacement curve obtained by the reproductive simulation and the load-displacement curve obtained by the actual rupture test agree with each other (S305, Yes), the stress value or the strain value of the LCD glass module that corresponds to the rupture load is computed (S307).

Then, the stress value or the strain value obtained in the above-described manner is stored in the results judging data DB in the database 3 as rupture threshold value that is associated with the LCD glass module (S308).

Thus, it is possible for the designer him- or herself to determine the evaluation threshold value for the results of the simulation in the above-described manner so that the designer can revise the evaluation threshold value to produce a better one without relying on an analysis specialist. It may be needless to say that the designer can utilize not only the results of the actual rupture test but also the threshold values determined on the basis of the results of the simulations executed for the designs in the past.

Figure 7:
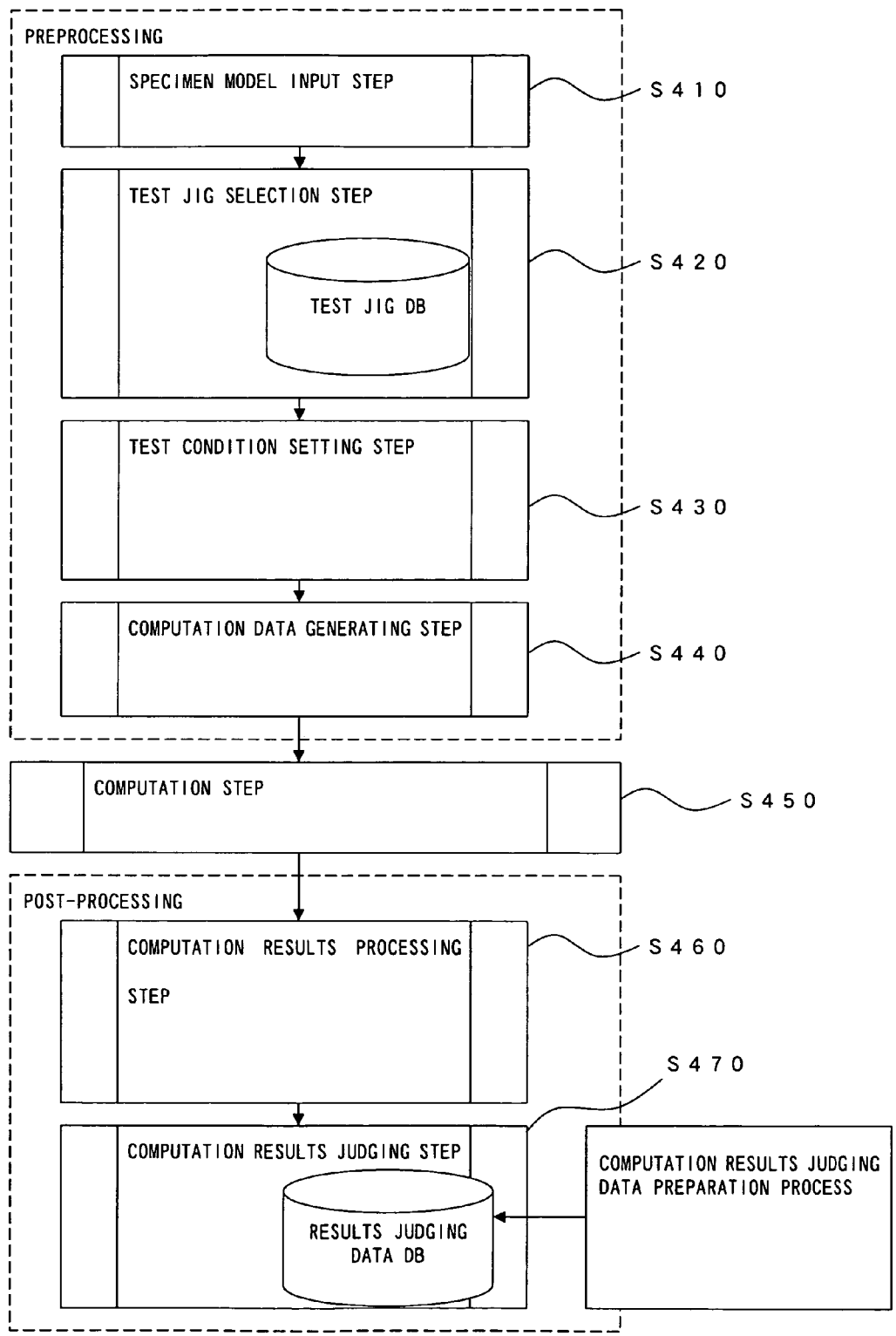
FIG. 7 is a flowchart of the process to be executed by the embodiment of simulation system of FIG. 1, summarily illustrating the overall process.
Figure 8:
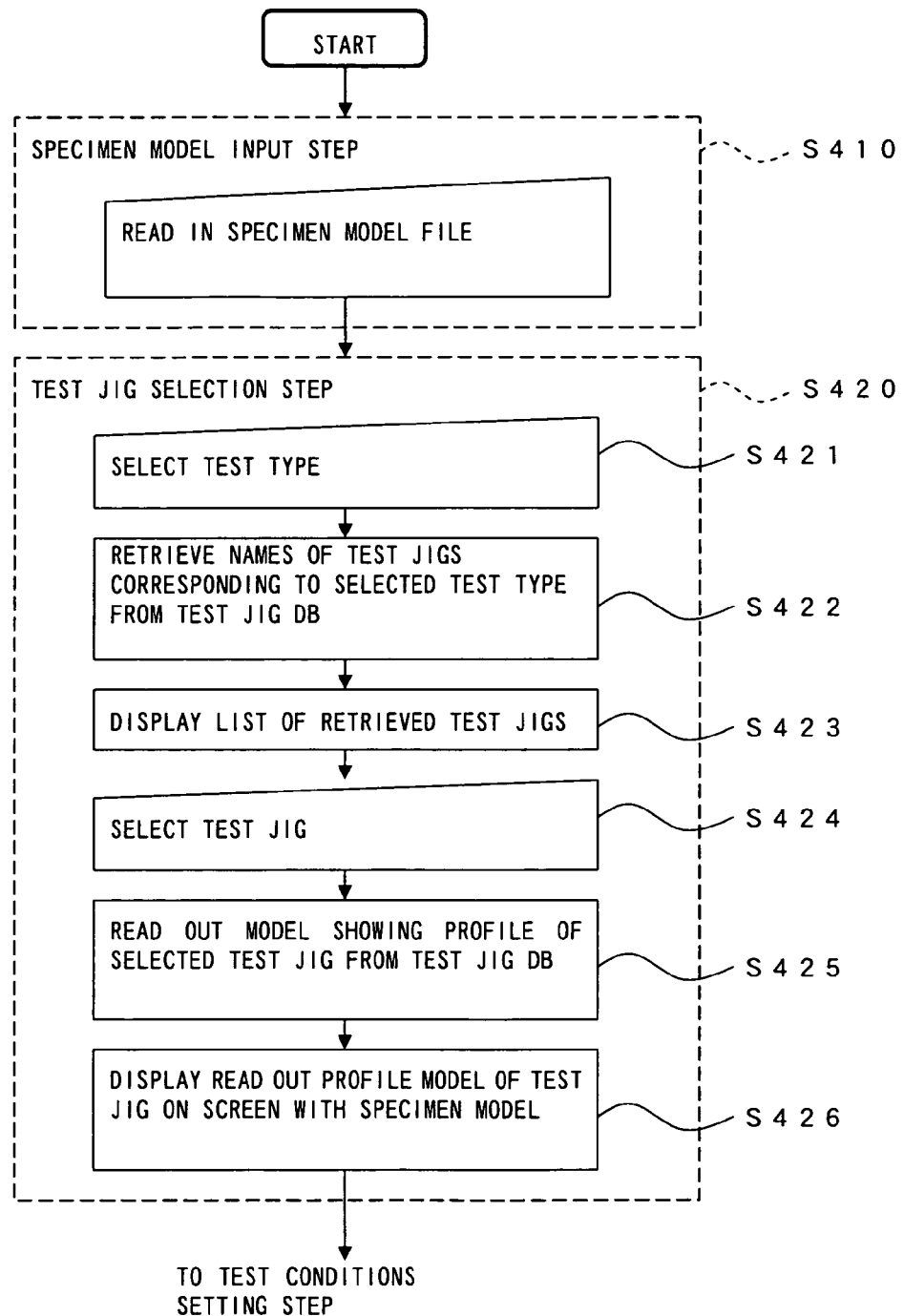
FIG. 8 is a flowchart of the process to be executed by the embodiment of simulation system of FIG. 1, illustrating each of the processing steps in greater detail.
Figure 9:
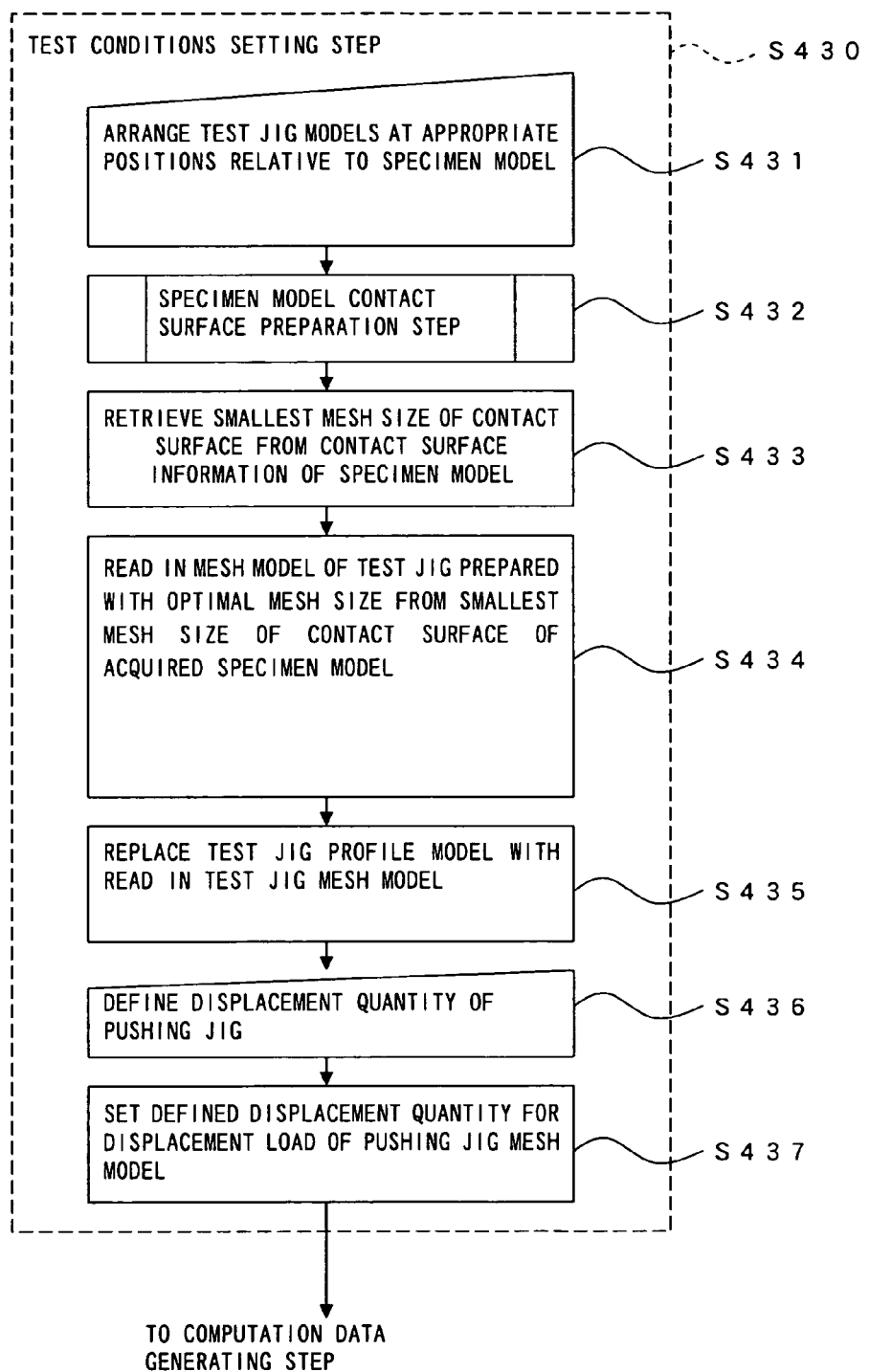
FIG. 9 is a flowchart of the process to be executed by the embodiment of simulation system of FIG. 1, illustrating each of the processing steps in greater detail.
Figure 10:
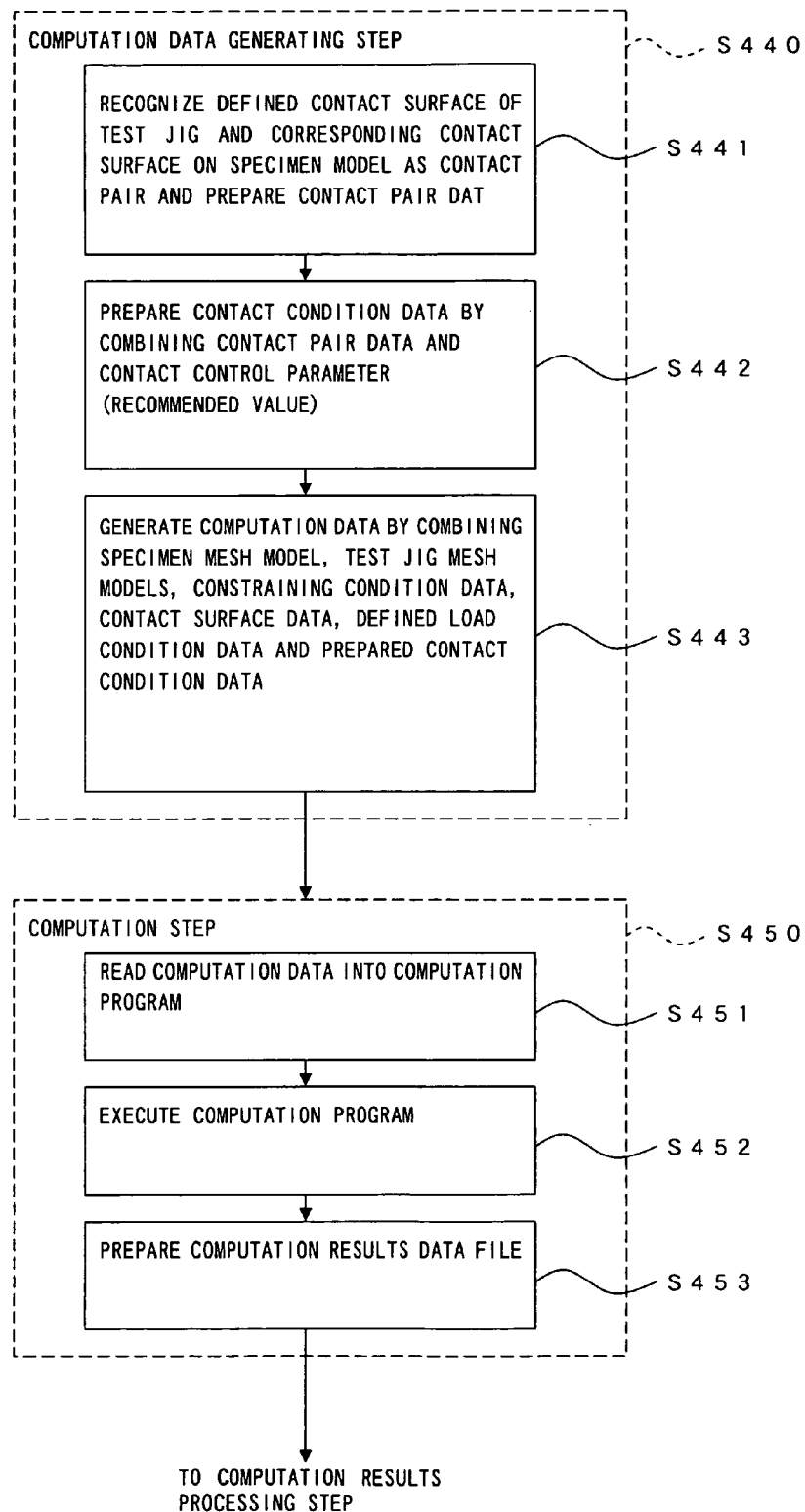
FIG. 10 is a flowchart of the process to be executed by the embodiment of simulation system of FIG. 1, illustrating each of the processing steps in greater detail.
Figure 11:
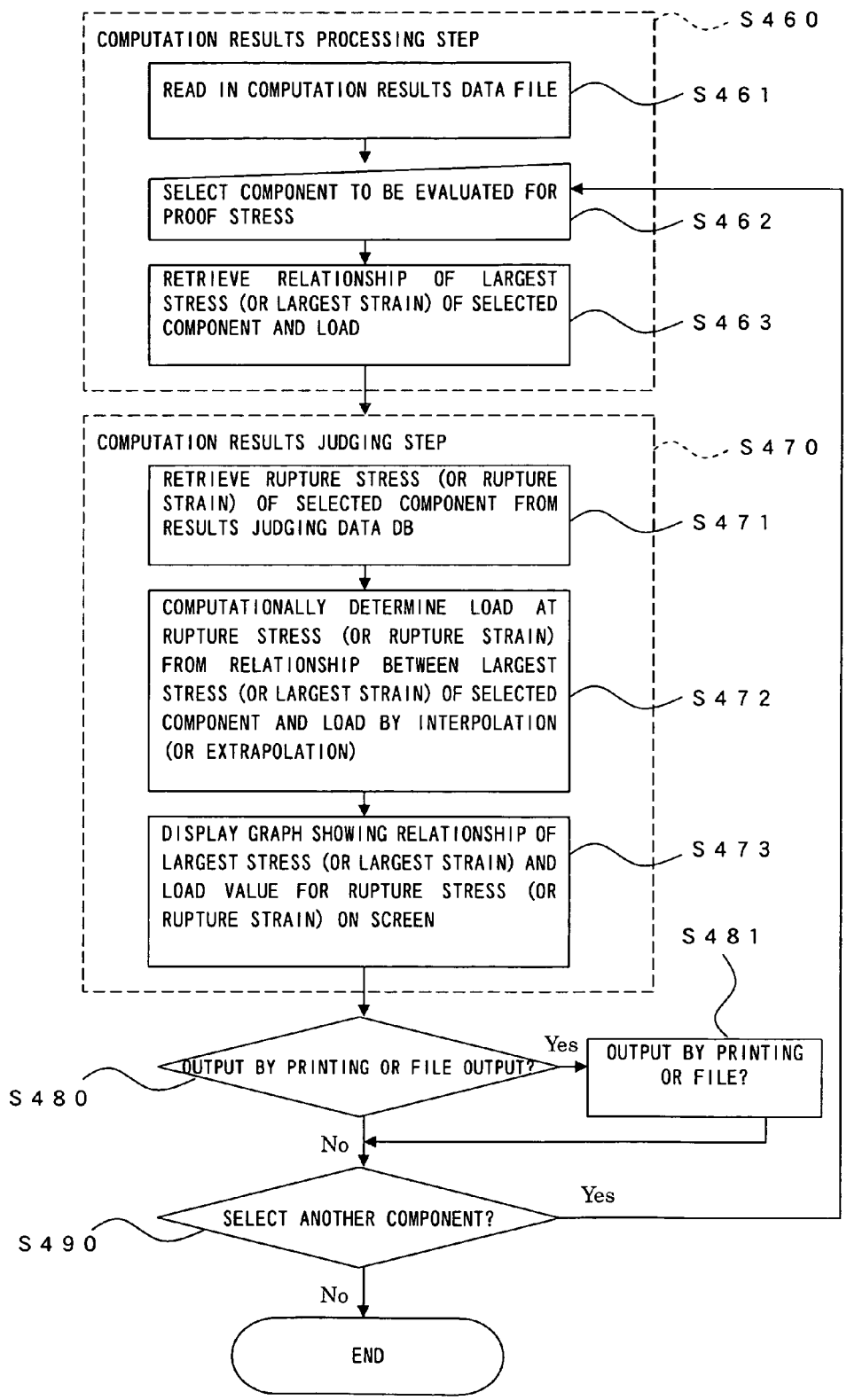
FIG. 11 is a flowchart of the process to be executed by the embodiment of simulation system of FIG. 1, illustrating each of the processing steps in greater detail.

FIG. 7 is a flowchart of the process to be executed by this embodiment of simulation system, summarily illustrating the overall process and FIGS. 8 through 11 are flowcharts of the process to be executed by the embodiment of simulation system of FIG. 1, illustrating each of the processing steps in greater detail.

As shown in FIG. 7, the processing operation to be executed by this embodiment of simulation system can be roughly divided into a specimen model input step (S410), a test jig selection step (S420), a test conditions setting step (S430), a computation data generating step (S440), a computation step (S450), a computation results processing step (S460) and a computation results judging step (S470). Now, each of the steps will be described below in detail.

Firstly, in the specimen model input step, the specimen model file to be analyzed is read in (S410).

Subsequently, the processing operation proceeds to the test jig selection step (S420), where the type of test selected by the user is acquired by the first set information acquiring section 101 (S421). Then, the second set information acquiring section 102 retrieves the names of the test jigs that correspond to the acquired type of test from the test jig DB in the database 3 (S422). Thereafter, a list of the retrieved test jigs is displayed on the display section (not shown) (S423) and, as the user selects test jigs from the displayed list of the test jigs (S424), the second set information acquiring section 102 reads out the models showing the profiles of the selected test jigs from the test jig DB (S425). The profile models of the test jigs read out in the above-described manner are displayed on the display screen of the display section (not shown) along with the specimen model (S426).

Then, the processing operation proceeds to the test conditions setting step (S430) and the user arranges the test jig models at respective positions relative to the specimen model that are arbitrarily selected by the user (S431). Then, an operation of preparing the contact surface of the specimen model is performed (S432). Thereafter, the smallest mesh size of the contact surface is retrieved from the contact surface information of the specimen model (S433). Then, the second set information acquiring section 102 reads in the mesh model of each of the test jigs that is prepared with the most suitable mesh size on the basis of the smallest mesh size of the contact surface of the specimen model that is acquired in the above-described manner (S434). Then, the test jig models are replaced by the mesh models of the test jigs read in by the second set information acquiring section 102 (S435). Subsequently, the quantity of displacement of the pushing jig acquired by the second set information acquiring section 102 is defined (S436) and the defined quantity of displacement is set for the displacement load of the pushing jig model (S437).

Thereafter, the processing operation proceeds to the computation data generating step (S440) and the contact surfaces on the specimen model that contact the respective the contact surfaces defined for the test jigs are recognized as so many contact pairs and contact pair data are prepared (S441). Thereafter, each of the contact pair data prepared in the above-described manner is combined with a contact control parameter that shows a recommended value to prepare contact condition data (S442). Then, the mesh model of the specimen, the mesh models of the test jigs, the constraining condition data, the contact surface data, the defined load condition data and the prepared contact condition data are combined to generate computation (simulation) data (S443).

Then, the simulation apparatus 2 acquires the computation data that are prepared in the above-described manner and the processing operation proceeds to the computation step (S450). In this step, firstly the computation data are read into the computation program in the simulation apparatus 2 (S451) and a simulation is executed (S452). A computation results data file is prepared as a result of the simulation (S453).

In the computation results processing step (S460), the computation results data file that is prepared by the simulation apparatus 2 is read in by the analysis results acquiring section 104 (S461) and as the component to be evaluated for proof stress is selected (S462), the relationship between the largest stress (or the largest strain) and the load of the selected component is retrieved (S463).

Subsequently, the processing operation proceeds to the computation results judging process (S470), and the rupture stress (or the rupture strain) of the selected component is retrieved from the results judging data DB in the database 3 (S471). The judging section 105 computationally determines the load at the rupture stress (or the rupture strain) by interpolation (or extrapolation) on the basis of the relationship of the largest stress (or the largest strain) and the load of the selected component (S472). Then, the graph showing the relationship between the largest stress (or the largest strain) and the load and the load width at the rupture stress (or the rupture strain) are displayed on the display screen of the display section (not shown) (S473).

When the results of judgment that are displayed on the display screen are to be output by printing or as a file (S480, Yes), the results of judgment are actually output by printing or as a file (S481). If the results of judgment are not to be output (S480, No) and another component is to be selected for a similar processing operation (S490, Yes), the processing operation returns to the step (S462) for selecting the component to be evaluated for proof stress. If no other component is to be selected for a similar processing operation (S490, No), the processing operation is ended.

Each of the above-described steps of the processing operation of the simulation system is realized as the simulation program stored in the memory 107 is executed by the CPU 106.

The above-described simulation program can be executed by the computer that operates also as communication terminal and communication control apparatus as it is stored in a computer readable recording medium. Computer readable recording mediums that can be used for the purpose of the present invention include portable type storage mediums including semiconductor memory devices such as CD-ROMs, flexible disks, DVDs, magneto-optical disks and IC cards, stationary type memory devices such as ROMs, RAMs and magnetic recording apparatus to be installed in computers, databases for holding programs, computers other than the computer in question and their databases.

While the simulation system of the above-described embodiment is installed separately from the simulation apparatus 2, the present invention is by no means limited thereto. For example, the simulation system of this embodiment may alternatively be installed and contained in the simulation apparatus 2.

While the judging section 105 of this embodiment is described above in terms of judging a "rupture" as a predetermined state of deformation, the present invention is by no means limited thereto. It may alternatively be arranged so as to judge a "plastic deformation" or an "elastic deformation".

Thus, with the above-described embodiment, the analysis specialist is required only to prepare an object of analysis model of a designed structure (including an operation of dividing the components of the structure into individual elements and selecting materials for them and an operation of defining the contact between any two components) so that the designer him- or herself can define all the operation of setting requirements for evaluating the strength of the structure to a great advantage of remarkably improving the efficiency of work.

Additionally, the obtained results of a simulation can be evaluated with ease if the values that each component is allowed to take (the physical values that can be computationally determined by simulation) are registered in the database and the results of the computational operation executed for the component are compared with the registered values that the component can take after a strength analysis simulation. If the data on the values that each component is allowed to take are shared by a plurality of designers, it is possible to objectively evaluate a structure without being affected by the experiences of the designers.

Still additionally, according to the present invention, it is possible to execute a simulation by following operation procedures that are equivalent to actual strength evaluation procedures including defining the positions for supporting the object to be tested and selecting jigs. Thus, if the user has an experience of actually conducting a strength evaluation test, he or she can conduct a virtual test, using a numerical simulation involving a sophisticated non-linear structure analysis without any strange feeling.

Conventionally, the operation of defining conditions of analysis that correspond to the simulation environment and various computation processes are assigned to an analysis specialist when executing a simulation so that much time has to be spent to exchange information between the designer and the analysis specialist. With this embodiment of simulation system according to the invention, on the other hand, the analysis specialist is required only to prepare a numerical model of a designed structure (including an operation of dividing the components of the structure into individual elements and selecting materials for them and an operation of defining the contact between any two components) so that the designer him- or herself can define all the operation of setting requirements for evaluating the strength of the structure to eliminate waste of time. Additionally, the designer is not required to prepare papers describing the conditions for evaluation to a great advantage of improving the efficiency of the overall operation.

Still additionally, with the above-described embodiment, the models of the jigs for supporting the model to be analyzed in a simulation are registered in advance in a memory region as library information. This arrangement is labor saving in terms of generating models of the jigs for supporting an object of analysis model in each simulation and eliminates dispersions of the profiles of the jigs that adversely affect the simulation so that it is possible to obtain results of simulation without dispersions.

While the present invention is described above in terms of a specific embodiment, it may be clear to those skilled in the art that the embodiment can be modified and altered in various different ways without departing from the spirit and scope of the present invention.

What is claimed is:

1. An analysis data judging apparatus comprising:

a memory;

an analysis results acquiring section that acquires analysis data relating to results of analysis of a strength analysis simulation executed for an object of analysis model, and stores the analysis data into the memory; and a judging section that determines whether the analysis data stored in the memory indicates fracture of a predetermined part or not according to a threshold value set for the predetermined part of the object of analysis model, the threshold value being a stress value or a strain value determined on the basis of a rupture value required for the predetermined part.

2. The apparatus according to claim 1, wherein, if the object of analysis model is constituted by a plurality of components, a threshold value is set for each of the plurality of components.

3. A simulation system comprising:

a memory;

a first set information acquiring section that acquires first set information set as information defining the simulation environment at a time of executing a strength analysis simulation for an object of analysis model, and stores the first set information into the memory;

a second set information acquiring section that acquires predetermined related information relating to the first set information or a predetermined parameter value for identifying the contents of the first set information as second set information preset according to the first set information stored in the memory so as to correspond to the first set information on the object of analysis model, and stores the second set information into the memory; and a simulation executing section that causes a computer to execute the strength analysis simulation in the simulation environment defined by the first set information and the second set information stored in the memory.

4. The simulation system according to claim 3, wherein the first set information acquiring section acquires information on supplying a load to the object of analysis model as the first set information, and the second set information acquiring section acquires information on a jig supporting the object of analysis model according to the information on the supplying a load as acquired by the first set information acquiring section.

5. The simulation system according to claim 3, wherein
the first set information acquiring section acquires information on a mesh size at a time of dividing the object of analysis model by a mesh as the first set information, and
the second set information acquiring section acquires information on the mesh size at the time of dividing the jig supporting the object of analysis model by a mesh according to the information on the mesh size acquired by the first set information acquiring section.

6. The simulation system according to claim 3, wherein
the first set information acquiring section acquires information on a size of the object of analysis model as the first set information, and
the second set information acquiring section acquires information on a size of a jig supporting the object of analysis model according to the information on the size of the object of analysis model as acquired by the first set information acquiring section.

7. A computer-readable medium
having recorded thereon a simulation program, which when executed by a computer, causes the computer to execute a process comprising:
acquiring analysis data relating to a result of analysis of a strength analysis simulation executed for an object of analysis model; and
determining whether the analysis data acquired in the acquiring for a predetermined part indicates fracture of the predetermined part or not according to a threshold value set for the predetermined part of the object of analysis model, the threshold value being a stress value or a strain value determined on the basis of a rupture value for the predetermined part.

8. The computer-readable medium according to claim 7, wherein,
if the object of analysis model is constituted by a plurality of components, a threshold value is set for each of the plurality of components.

9. The computer-readable medium according to claim 7, wherein the process further comprises:
acquiring first set information set as information defining a simulation environment at a time of executing a strength analysis simulation for an object of analysis model;
acquiring predetermined related information relating to the first set information or a predetermined parameter value for identifying contents of the first set information as second set information preset according to the first set information acquired in the acquiring of the first set information so as to correspond to the first set information on the object of analysis model; and
executing the strength analysis simulation in the simulation environment defined by the first set information acquired in the acquiring of the first set information and the second set information acquired in the acquiring of the second set information.

10. The computer-readable medium according to claim 9, wherein
the acquiring of the first set information acquires information on supplying a load to the object of analysis model as the first set information, and
the acquiring of the second set information acquires information on a jig supporting the object of analysis model according to the information on the supplying a load as acquired in the acquiring of the first set information.

11. The computer-readable medium according to claim 9, wherein
the acquiring of the first set information acquires information on a mesh size at a time of dividing the object of analysis model by a mesh as the first set information and
the acquiring of the second set information acquires information on the mesh size at a time of dividing a jig supporting the object of analysis model by a mesh according to the information on the mesh size acquired in the acquiring of the first set information.

12. The computer-readable medium according to claim 9, wherein
the acquiring of the first set information acquires information on a size of the object of analysis model as the first set information and
the acquiring of the second set information acquires information on the size of a jig supporting the object of analysis model according to the information on the size of the object of analysis model as acquired in the acquiring of the first set information.

* * * * *